United States Patent [19]

Nakamura

[11] Patent Number: 5,666,369
[45] Date of Patent: Sep. 9, 1997

[54] METHOD AND ARRANGEMENT OF DETERMINING ERROR LOCATIONS AND THE CORRESPONDING ERROR PATTERNS OF RECEIVED CODE WORDS

[75] Inventor: Masaru Nakamura, Tokyo, Japan

[73] Assignee: NEC Corporation, Tokyo, Japan

[21] Appl. No.: 238,751

[22] Filed: Apr. 28, 1994

[30] Foreign Application Priority Data

Apr. 28, 1993 [JP] Japan ..................... 5-101677

[51] Int. Cl.$^6$ ............................................. H03M 13/00
[52] U.S. Cl. .................................................. 371/37.07
[58] Field of Search .......................................... 371/37.1

[56] References Cited

U.S. PATENT DOCUMENTS

| | | | |
|---|---|---|---|
| 4,584,686 | 4/1986 | Fritze | 371/37.1 |
| 4,845,713 | 7/1989 | Zook | 371/37.1 |
| 5,001,715 | 3/1991 | Weng | 371/37.1 |
| 5,365,529 | 11/1994 | Mester | 371/37.1 |

*Primary Examiner*—Stephen M. Baker
*Attorney, Agent, or Firm*—Foley & Lardner

[57] ABSTRACT

In order to simplify a hardware arrangement of a so-called Chien's searching circuit, an error location counter is provided. The error location counter counts up in response to each execution for detecting an error in a code word. If an error is detected in the code word, the content of the error location counter is latched by a suitable storage means and then applied to an external circuit.

4 Claims, 4 Drawing Sheets

METHOD AND ARRANGEMENT OF DETERMINING ERROR LOCATIONS AND THE CORRESPONDING ERROR PATTERNS OF RECEIVED CODE WORDS

BACKGROUND OF THE INVENTION

1. Field of the Invention

The present invention relates generally to a method and arrangement of ascertaining error locations and the corresponding error patterns of a decoded code word(s) in a digital data communications system, and more specifically to such a method and arrangement using a so-called Chien's searching algorithm.

2. Description of Prior Art

Before turning to the present invention it is deemed advantageous to briefly discuss prior art with reference to FIGS. 1 and 2.

FIG. 1 is a block diagram schematically showing an overall error correcting arrangement which follows a suitable decoder such as a Viterbi decoder.

Code words, outputted from the above mentioned decoder, are successively applied to a syndrome calculator 10 and a memory 12. The memory 12 is to delay the code words applied thereto by a predetermined time period in order to compensate for delay of the code words induced while processed by blocks 10, 14, 16 and 18.

The syndrome calculator 10 produces syndromes from the code words applied thereto. A polynomial generator 14 is provided to issue two polynomials: one is an error-locator polynomial and the other is an error numerical value polynomial. These two polynomials wall will be given later.

The aforesaid two polynomials, obtained at the block 14, are applied to the next stage, viz., an error location and error pattern determiner 16 which is directly concerned with the present invention.

The block 16 generates error location data and error pattern data which are applied to an error corrector 20 via an error data check circuit 18. The error corrector 20 implements error correction included in the code words applied thereto from the memory 12 using the error location data and the error pattern applied thereto from the data check circuit 18. Thus, error corrected code words can be derived from the error corrector 20.

The above mentioned error correction using the syndrome scheme is well known in the art. For further details reference should be made to a book entitled "Error Control Coding" by Shu Lin, et al., published 1983 by Prentice-Hall, Inc. Englewood Cliffs, N.J. 07632, merely by way of example.

As is known in the art, a so-called Chien's searching algorithm has proven suited for error correction of code words in Galois field $GF(2^m)$ (m is a positive integer). In more specific terms, the Chien's searching algorithm is to determine error locations and the corresponding error patterns using an error-locator polynomial (depicted by $\sigma(X)$) and an error numerical value polynomial (depicted by $p(X)$) both derived from Euclid's algorithm. The root of $\sigma(X)=0$ indicates an error location. Therefore, let $\alpha$ be a primitive element in $GF(2^m)$. Briefly speaking, the Chien's searching circuit is arranged such as to successively replace "X" with $\alpha^0, \alpha^{-1}, \alpha^{-2}, \ldots$ and check to see if outputs of an exclusive-or thereof assume zeros.

FIG. 2 is a block diagram schematically showing a known Chien's searching circuit which determines error locations and the corresponding error patterns of the code words applied thereto. The error location polynomial $\sigma(X)$ and the error numerical value polynomial $p(x)$ are respectively given by $$\sigma(X)=\sigma_t X^t + \sigma_{t-1} X^{t-1} + \ldots + \sigma_2 X^2 + \sigma_1 X + \sigma_0 \quad (1)$$

$$p(X)=p_{t-1} X^{t-1} + \ldots + p_2 X^2 + p_1 X + p_0 \quad (2)$$

Further, the number of the maximum correctable symbols is denoted by "t".

In the present disclosure, term "symbol" implies a component which forms part of a code word. In other words, a code word consists of a plurality of symbols each of which has a predetermined bit length.

In FIG. 2, error location data $(\alpha^{-i})(i=0, 1, 2, \ldots)$ is obtained using the following blocks: registers R1–Rt, selectors S1–St, multipliers M1–Mt, an exclusive-or gate E1, an all-zero detector 30, a power index counter 31 and a index-vector converter 32. It is assumed, merely for the sake of simplifying the descriptions, that the multipliers M1, M2, ..., M(t−1), and Mt are respectively provided with registers (not shown) for storing $\alpha^{-1}, \alpha^{-2}, \ldots, \alpha^{1-t}$, and $\alpha^{-t}$.

On the other hand, the arrangement for obtaining the corresponding error pattern data $(e_i)$ includes, two exclusive-or gates E2 und E3, multipliers MA0–MA(t−1) and MB0–MB(t−1), and an error pattern calculator 34, in addition to the above mentioned blocks R1–Rt, S1–St, and M1–Mt. As in the above, it is assumed that the multipliers MA0, MA1, MA2, ..., and MA(t−1) are respectively provided with register (not shown) for storing $\sigma_0^{-1}, \sigma_1^{-1}, \sigma_2^{-1}, \ldots,$ and $\sigma_{t-1}^{-1}$. In the similar manner, it is assumed that he multipliers MB0, MB1, MB2, ..., and MB(t−1) are respectively provided with registers (not shown) for storing $p_0, p_1, p_2, \ldots, p_{t-1}$.

Prior to initiating the operations of the FIG. 2 arrangement, the multipliers M1, M2, ..., M(t−1), and Mt store respectively $\alpha^{-1}, \alpha^{-2}, \ldots, \alpha^{1-t}$ and $\alpha^{-t}$ in the corresponding registers (not shown) thereof. Further, the multipliers MA0, MA1, MA2, ..., and MA(t−1) store respectively $\sigma_0^{-1}, \sigma_1^{-1}, \sigma_2^{-1}, \ldots,$ and $\sigma_{t-1}^{-1}$ in the corresponding registers (not shown) thereof. Similarly, the multipliers MB0, MB1, MB2, ..., and MB(t−1) store respectively P0, P1, P2, ..., $P_{t-1}$ within the corresponding registers (not shown) thereof.

Firstly, in order to replace X of Equation (1) with $\alpha^0$ (viz., i=0), the coefficients $\sigma_0, \sigma_1, \sigma_2, \ldots, \sigma_{t-1},$ and $\sigma_t$ are applied to the arrangement of FIG. 2 from the polynomial generator 14. In more specific terms, $\sigma_0$ is directly applied to the exclusive-or gate E1, while $\sigma_1, \sigma_2, \ldots, \sigma_{t-1},$ and $\sigma_t$ are respectively applied to the exclusive-or gate E1 via the selectors S1, S2, ..., S(t−1), and St. That is to say, when i=0, each of selector S1–St selects the coefficients applied thereto from the generator 14.

The gate E1 implements exclusive-or operations of the corresponding bits of the coefficients $\sigma_o, \sigma_1, \sigma_2, \ldots, \sigma_{t-1},$ and $\sigma_t$. The outputs of the exclusive-or gate E1 are applied to the all-zero detector 30. It is assumed for a better understanding that each of the coefficients $\sigma_0, \sigma_1, \sigma_2, \ldots, \sigma_{t-1},$ and $\sigma_t$ has a bit length of eight. In such a case, the gate E1 carries out eight exclusive-or operations at the same time. More specifically, if $\sigma_0$=0000 0000

$\sigma_1$=0000 0000

$\sigma_2$=0000 0000

\*\*\*\*

$\sigma_{t-1}$=0000 0000

$\sigma_t$=0000 0000 then the eight outputs of the exclusive-or gate E1 exhibit all "0"s. Thus, the detector 30 detects this situation which is applied to the index-vector converter 32 and the power index counter 31. More specifically, before the arrangement of FIG. 2 starts the operation thereof, the counter 31 is reset such that the power index "i" of $\alpha^{-i}$ indicates "+1". Thereafter, the counter 31 decrements the power index "i" by one each time the exclusive or gate E1 issues its output. In the above-mentioned initial stage (cycle), the counter 31 applies $\alpha^0$ to the error pattern calculator 34.

While the exclusive-or gate E1 implements the above mentioned operations, the multipliers M1, M2, ..., M(t−1), and Mt multiplication respectively the output of the selectors S1, S2, ..., S(t−1), and St by $\alpha^{-1}, \alpha^{-2}, \ldots, \alpha^{1-t}$ and $\alpha^{-t}$. The multiplication results $\sigma_1\alpha^{-1}, \sigma_2\alpha^{-2}, \ldots, \sigma_{t-1}\alpha^{1-t}$ and $\sigma_t\alpha^{-t}$ are respectively latched by the registers R1, R2, ..., R(t−1), and Rt.

Following this, in order to replace X of Equation (1) with $\alpha^1$ (viz., i=1), $\sigma_0$ is directly applied to the exclusive-or gate E1 as in the, above case. However, the selectors S1, S2, ..., S(t−1), and St, in turn, selects the corresponding contents stored in the registers R1, R2, ..., R(t−1), and Rt. Accordingly, the exclusive-or gate E1 is supplied within $\sigma_0$, $\sigma_1\alpha^{-1}, \sigma_2\alpha^{-2}, \ldots, \sigma_{t-1}\alpha^{1-t}$, and $\sigma_t\alpha^{-t}$. Thereafter, the same operations as mentioned above are implemented at the gate E1. In the event that the detector 30 detects all "0"s of the results issued from the exclusive-or gate E1 the power index counter 31 issues $\alpha^{-1}$ which indicates an error location.

Furthermore, in order to replace X of Equation (1) with $\alpha^2$ (viz., i=2), $\sigma_0$, is directly applied to the exclusive-or gate E1. As in the case of i=1, the selectors S1, S2, ..., S(t−1), and St select the corresponding contents stored in the registers R1, R2, ..., R(t−1) and Rt, respectively. Accordingly, the exclusive-or gate E1 is supplied with $\sigma_0, \sigma_1\alpha^{-2}, \sigma_2\alpha^{-4}, \ldots, \sigma_{t-1}\alpha^{2-2t}$, and $\sigma_t\alpha^{-2t}$. Thereafter, the same operations as mentioned in the above two cases are implemented thereat.

These operations are iterated until i=n wherein it is readily understood that $\sigma_0, \sigma_1\alpha^{-n}, \sigma_2\alpha^{-2n}, \ldots, \sigma_{t-1}\alpha^{n-m}$, and $\sigma_t\alpha^{-m}$ are applied to the exclusive-or gate E1.

An error location is defined as an index $\alpha^{-i}(\sigma(\alpha^{-i})=0)$ which is applied to the index-vector converter 32 and is then converted into the corresponding vector. The vector thus obtained is applied to the next stage, viz., the error data check circuit 18 (FIG. 1). The index-vector converter 32 is required to have a lookup-table (not shown) previously stored in a ROM (Read Only Memory) for the index-vector conversion.

As is well known in the art, a primitive polynomial f(X) over $GF(2^8)$ is given by $$f(X)=X^8+X^4+X^3+X^2+1 \qquad (3)$$

Therefore, the index-vector pairs (viz., table of Galois Field $GF(2^8)$) stored in the ROM are

| | |
|---|---|
| — | = 0000 0000 |
| $\alpha^0$ | = 1000 0000 |
| $\alpha^1$ | = 0100 0000 |
| $\alpha^2$ | = 0010 0000 |
| $\alpha^3$ | = 0000 1000 |
| ... | ... |
| $\alpha^{125}$ | = 1100 1100 |
| $\alpha^{126}$ | = 0110 0110 |
| $\alpha^{127}$ | = 0011 0011 |
| $\alpha^{128}$ | = 1010 0001 |
| ... | ... |
| $\alpha^{251}$ | = 0001 1011 |
| $\alpha^{252}$ | = 1011 0101 |
| $\alpha^{253}$ | = 1110 0010 |
| $\alpha^{254}$ | = 0111 0001 |

That is, the above mentioned index-vector conversion requires 256 index-vector pairs stored in the ROM. Further, if $GF(2^{10})$ is used, then the index-vector pairs amount to a very large number of 1024. The tables of Galois Fields are shown in APPENDIX A of the aforesaid reference book.

When the error location $\alpha^{-i}(\sigma(\alpha^{-i})=0)$ is ascertained, the error pattern calculator 34 acquires the outputs of the counter 31 and the exclusive-or gates E2 and E3 in order to obtain the corresponding error pattern $e_i$. The error pattern $e_i$ is given by $$e_i=p(X)/[\sigma'(X)\cdot X] \qquad (4)$$

When error location $\alpha^{-i}$(viz., $\sigma(\alpha^{-i})=0$) is defined, the corresponding error pattern is determined by substituting X for $\alpha^{-i}$ and is implemented by the hardware arrangement which includes the exclusive-or gates E2 and E3, the multipliers MA0–MA(t−1) and MB0–MB(t−1), and the error pattern calculator 34.

The numerator $p(\alpha^{-i})$ of Equation (4) is calculated as follows. The multiplier MA0, MA1, MA2, ..., MA(t−1) multiply $\sigma_0, \sigma_1\alpha^{-i}, \sigma_2\alpha^{-2i}, \ldots, \sigma_{t-1}\alpha^{i-ti}$ by the reciprocals of the coefficients of Equation (2), viz., $\sigma_0^{-1}, \sigma_1^{-1}, \sigma_2^{-1}, \ldots, \sigma_{t-1}^{-1}$, respectively. Thereafter, the following multipliers MB0, MB1, MB2, ..., MB(t−1) multiply the outputs of the preceding multipliers MA0, MA1, MA2, ..., MA(t−1) by $p_0, p_1, p_2, \ldots, p_{t-1}$, respectively. Thus, the multiplication results $p_0, p_1\alpha^{-n}, p_2\alpha^{-2n}, \ldots, p_{t-1}\alpha^{n-m}$ are applied to the exclusive-or gate E3. This gate E3 implements the exclusive-or operations of the corresponding bits of each of the above mentioned multiplication results as in the gate E1. The output of the exclusive-or gate E3 is applied to the error pattern calculator 34.

The denominator [$\sigma'(X)\cdot X$] of Equation (4) is calculated as follows. The exclusive-or gate E2 receives the selector's outputs wherein each of the suffixes of $\sigma$ exhibits an odd number. That is, the exclusive-or gate E2 receives $\sigma_1\alpha^{-n}, \sigma_3\alpha^{-3n}, \ldots, \sigma_{t-3}\alpha^{-(t-3)n}, \sigma_{t-1}\alpha^{-(t-1)n}$ which are respectively generated from the selectors S1, S3, ..., S(t−3) and S(t−1) (although the selectors S3 and S(t−3) are not shown in FIG. 2).

The error pattern calculator 34 is supplied with the outputs of the counter 31 and the exclusive-or gates E2 and E3, and outputs the error pattern $e_i$ after executing the following divisional operation:

$$e_i=p(\alpha^{-i})/[\sigma'(\alpha^{-i})\cdot\alpha^{-i}]$$

The above mentioned known Chien's searching, however, has suffered from the drawbacks that the index $\alpha^{-i}(\sigma(\alpha^{-i})=0)$ should be converted into the corresponding vector using a large lookup table stored in a ROM. As discussed above, if $GF(2^8)$ then the number of the index-vector pairs amounts to 255, while if $GF(2^{10})$ then the number of the index-vector pairs amounts to 1024. In addition to this problem, the error data check circuit 18 (FIG. 1) is undesirably required to define the error location using the vector applied thereto from the Chien's searching circuit.

Still further, with the prior art, determining the error pattern data requires the reciprocals of the coefficients of the error-location polynomial. These reciprocal are usually obtained using a table stored in a ROM (not shown in FIG. 2). Further, the two multiplying circuits (MA0–MA(t−1) and MB–MB(t−1)) are required which inevitably require a plurality of registers for temporarily storing intermediate values. These complex circuitry renders it difficult to fabricate the arrangement of FIG. 2 by LSI (Large Sale Integration) techniques.

SUMMARY OF THE INVENTION

It is an object of the present invention to provide a so-called Chien's searching circuit which features a simplified arrangement and thus is well suited for fabrication thereof using LSI techniques.

In brief, the above object is achieved by technique wherein in order to simplify a hardware arrangement of a so-called Chien's searching circuit, an error location counter is provided. The error location counter counts up in response to each execution for detecting an error in a code word. If an error is detected in the code word, the content of the error location counter is latched by a suitable storage means and then applied to en eternal circuit.

BRIEF DESCRIPTION OF THE DRAWINGS

The features and advantages of the present invention will become more clearly appreciated from the following description taken in conjunction with the accompanying drawing in which like elements are denoted by like reference numerals and in which.

DETAILED DESCRIPTION OF THE PREFERRED EMBODIMENTS

Figure 3:
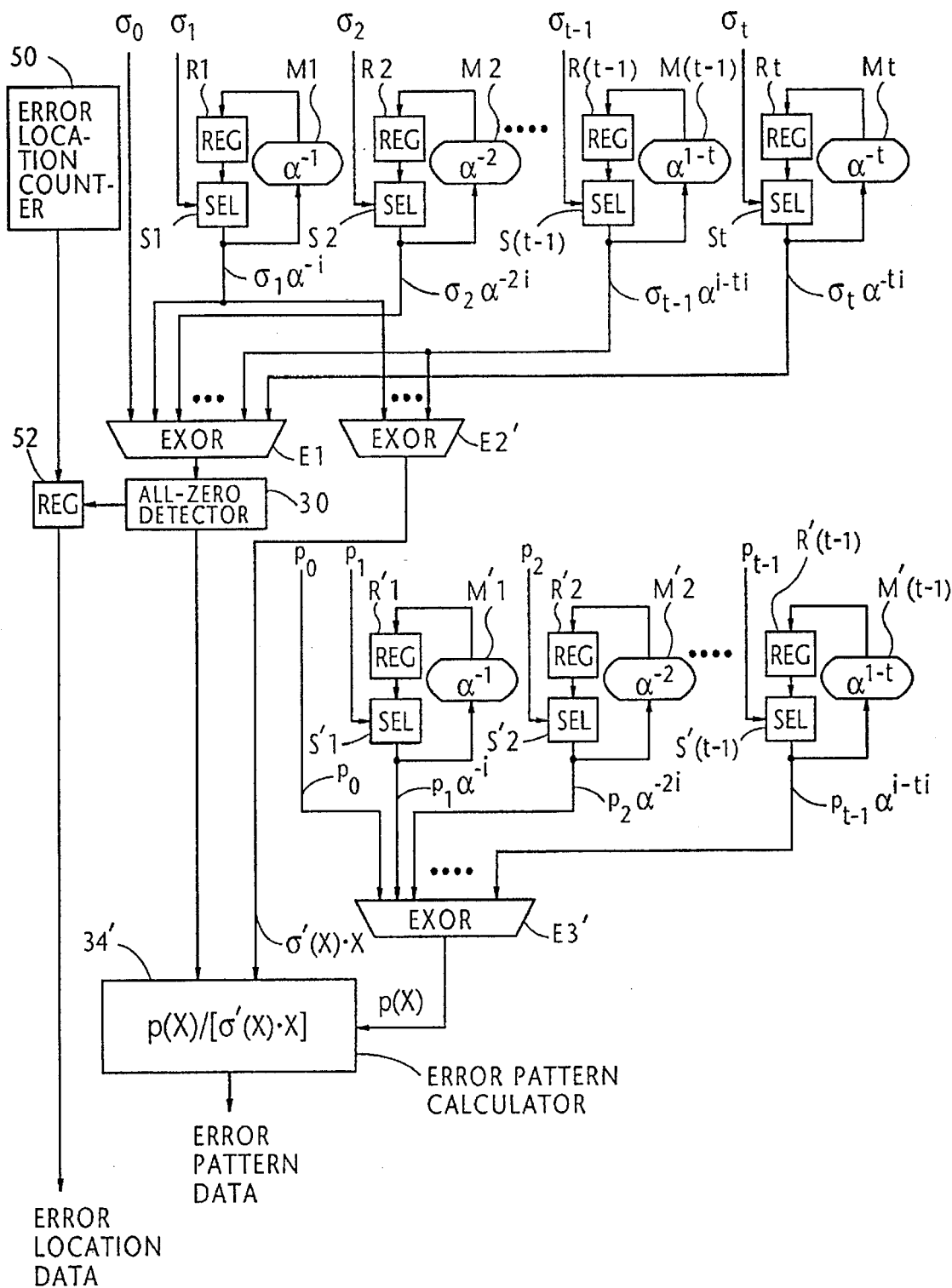
FIG. 3 is a block diagram showing one embodiment of the present invention.

Reference is now made to FIG. 3, wherein an embodiment of the present invention is shown in block diagram form.

An arrangement of the embodiment for determining error locations, differs from that of the prior art (FIG. 1) in that the former arrangement is provided with an error location counter 50 And a register 52 in lieu of the index-vector converter 32. Accordingly, the blocks of FIG. 3, which have been shown in FIG. 2, are labelled with like characters and numerals.

The circuit operations up to detecting all "0"s at the detector 30 of the embodiment are essentially the same as the arrangement of FIG. 1 and thus, merely the descriptions relevant to the present invention will be given.

The error location counter 50 is initialized prior to commencing the operations of the arrangement of FIG. 3.

Figure 2:
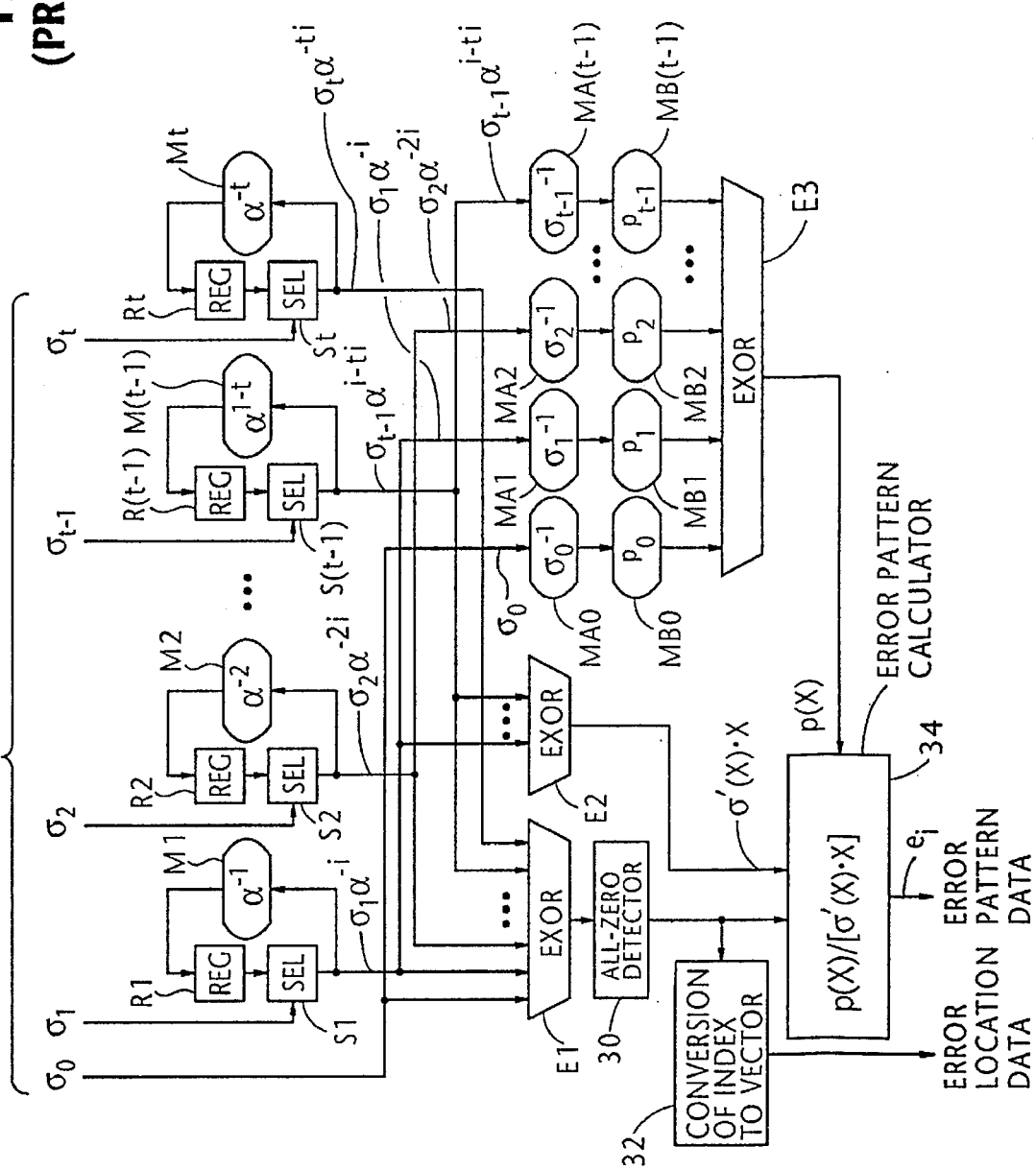
FIG. 2 is a block diagram showing a known Chien's searching circuit.

The error location counter 50 increments the content thereof by one in response to the first step wherein the coefficients $\sigma_0, \sigma_1, \sigma_2, \ldots, \sigma_{t-1}$, and $\sigma_t$ are applied to the arrangement of FIG. 2 from the polynomial generator 14.

Following this, as above mentioned, in order to replace X of Equation (1) with $\alpha^1$ (viz., i=1), $\sigma_0$ is directly applied to the exclusive-or gate E1 as in the above case. The selectors S1, S2, . . . , S(t-1) and St, select respectively the corresponding contents stored in the registers R1, R2, . . . , R(t-1) and Rt. Accordingly, the exclusive-or gate E1 is supplied with $\sigma_0, \sigma_1\alpha^{-1}, \sigma_2\alpha^{-2}, \ldots, \sigma_{t-1}\alpha^{1-t}$ and $\sigma_t\alpha^{-t}$. The error location counter 50, in response to this second step, further increments the content thereof by one.

Thus, in the following steps, the error location counter 50 increments the content thereof by one in response to each of the steps. In other words, it can be said that the counter 50 counts up by one each time the exclusive-or gate E1 issues the outputs thereof.

Figure 1:
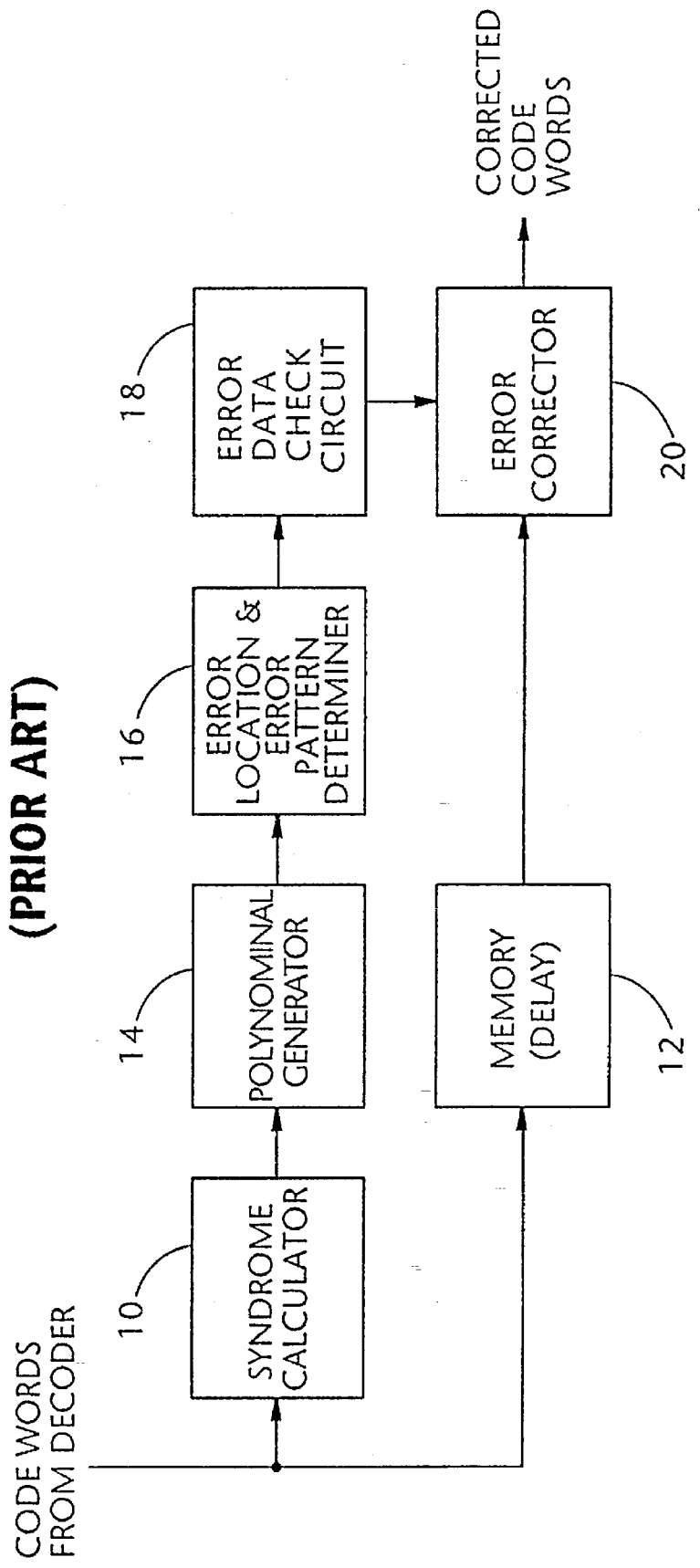
FIG. 1 is a block diagram schematically showing an overall error correction arrangement, this figure having been referred to in the opening paragraphs.

In the above, if the all-zero detector 30 detects that the outputs of the exclusive-or gate E1 exhibits all zeros, the register 52 latches the content of the error location counter 50 and then applies same to the following circuit, viz., the error data check circuit 18 (FIG. 1). It will be readily appreciated that the content of the error location counter 50, latched by the register 52, is able to specify which symbol of the code word contains the error. If the error data check circuit 18 (FIG. 1) is configured such as to correctly locate error position(s) according to the counter output(s) applied thereto from the register 52, the index-vector conversion of the prior art is no longer required.

Thus, the present embodiment is able to markedly lessen the burden on the hardware arrangement as compared with the prior art.

Determining an error pattern according to the present embodiment will be discussed below.

The arrangement dedicated to determining the error pattern, includes selectors S1', S2', . . . , S(t-1)', registers R1', R2', . . . , R(t-1)', multipliers M1', M2', . . . , M(t-1)', exclusive-or gates E2' and E3', a power index counter 31 and an error pattern calculator 34'. The gates E2' and E3' operate in exactly the same manner as their counterparts E2 and E3. Similarly, the calculator 34' functions in exactly the same manner as the counterpart 34. It is assumed that each of he multipliers M1'–M(t–1)' includes a register (not shown) for storing contents as mentioned below.

Prior to initiating the operations of the FIG. 3 arrangement, the following constants are set to the multipliers M1', M2', . . . , and M(t–1)'. That is, the multipliers M1', M2', . . . , and M(t–1)' store respectively $\alpha^{-1}, \alpha^{-2}, \ldots$, and $\alpha^{l-t}$ in the corresponding registers thereof (not shown).

The numerator $p(\alpha^{-i})$ of Equation (4) is calculated as follows. Upon starting the first step wherein X of Equation is replaced with $\alpha^0$ (viz., i=0) in the portion for the above mentioned error location detection, the coefficient $p_0$ is directly applied to the exclusive-or gate E3', while $p_1, p_2, \ldots$, and $p_{t-1}$ are respectively applied to the exclusive-or gate E3' via the selectors S1', S2', . . . , and S(t-1)'. That is to say, when i=0, each of the selectors S1'–S(t–1)' selects the coefficients applied thereto.

The gate E3' performs, during the first stage, exclusive-or operations on the corresponding bits of the coefficients $p_0, p_1, p_2, \ldots$, and $p_{t-1}$. Further, during the first stage, the multipliers M1'–M(t–1)' multiply the outputs of the corresponding selectors S1'–S(t–1)' by $\alpha^{-1}, \alpha^{-2}, \ldots, \alpha^{l-t}$, respectively. Thereafter, the multiplication results $p_1\alpha^{-1}, p_2\alpha^{-2}, \ldots$, and $p_{t-1}\alpha^{l-t}$ are respectively latched by the registers R1', R2', . . . , R(t-1)' and.

In the following steps, the selectors S1'–S(t–1)'select the corresponding registers R1'–R(t–1)', respectively. Accordingly, in the second step, the exclusive-or gate E3' is supplied with $p_1\alpha^{-1}, p_2\alpha^{-2}, \ldots$, and $p_{t-1}\alpha^{l-t}$ in addition to $p_0$ directly applied thereto from the calculator 14 (FIG. 1). During the second step, the contents of the registers R1'–R(t-1)' are renewed. These operations are repeated until the final stage is completed.

When the error location $\alpha^{-i}$ is ascertained, the error pattern calculator 34' acquires he outputs of the exclusive-or gates E2' and E3' and calculates the error pattern data using Equation (4) which has been described in the opening paragraphs. The operations of he error pattern calculator 34' are identical to those of the prior art and thus, further descriptions thereof will be omitted.

Figure 4:
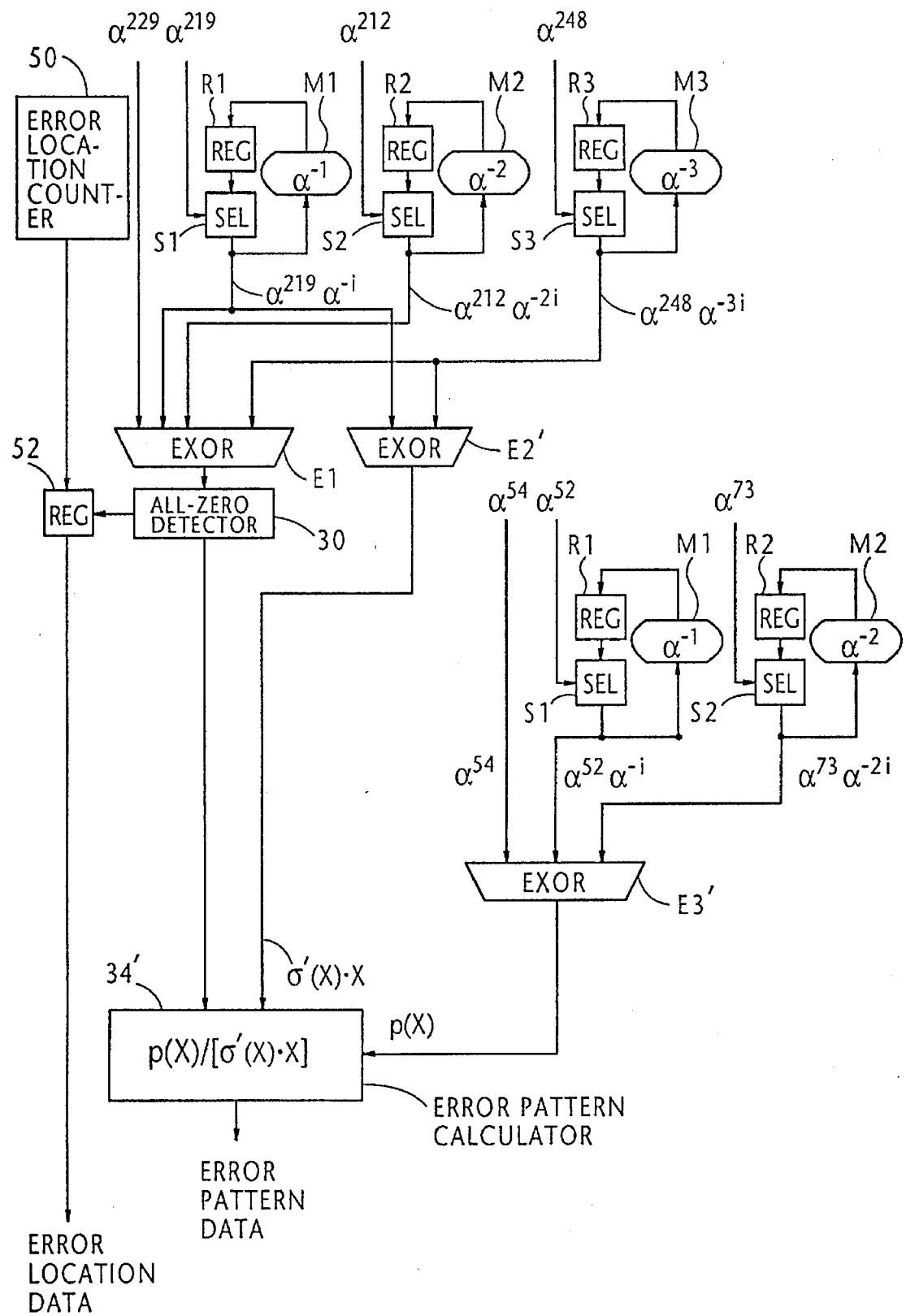
FIG. 4 is a block diagram showing one example of the embodiment for a better understanding of the instant invention.

FIG. 4 is a block diagram showing one concrete example wherein the embodiment of FIG. 3 is applied to a particular case of $GF(2^8)$. Thus, the circuit configuration of FIG. 4 can readily be appreciated in view of FIG. 3 and as such, we will directly enter into the operations of the FIG. 4 arrangement omitting the discussion of the hardware arrangement thereof.

As mentioned above, a primitive polynomial f(X) over $GF(2^8)$ is defined by $$f(X)=X^8+X^4+X^3+X^2+1$$

It is assumed that: (a) a transmitter (not shown) has transmitted a code word including 16 symbols each having a bit length of eight and being set to all "0"s, (b) the code word received includes three symbols which exhibit errors and (c) the three symbols including error are depicted by $\alpha^3$, $\alpha^8$ and $\alpha^{11}$. The code word received is represented by

[(00000000), (00000000), (00000000),
$\alpha^3$,           (00000000), (00000000),
(00000000), (00000000), (00000000),
(00000000),   $\alpha^8$   (00000000),
(00000000),   $\alpha^{11}$, (00000000),
(00000000)]

In this case, the error location polynomial $\sigma(X)$ and the error numerical value polynomial p(x) are respectively given by $$\sigma(X)=\alpha^{248}X^3+\alpha^{212}X^2+\alpha^{219}X+\alpha^{229}$$

$$p(X)=\alpha^{73}X^2+\alpha^{52}X+\alpha^{54}$$

As shown, the coefficients $\alpha^{248}$, $\alpha^{212}$, $\alpha^{219}$, and $\alpha^{229}$ are initially applied to the arrangement of FIG. 4 as illustrated. It is understood, from the error positions of the received data, that the three locations are $\alpha^{-2}$, $\alpha^{-5}$ and $\alpha^{-12}$, respectively.

That is, $$\sigma(\alpha^{-2}) = \alpha^{248}(\alpha^{-2})^3 + \alpha^{212}(\alpha^{-2})^2 + \alpha^{219}(\alpha^{-2}) + \alpha^{229}$$
$$= 0$$
$$\sigma(\alpha^{-5}) = \alpha^{248}(\alpha^{-5})^3 + \alpha^{212}(\alpha^{-5})^2 + \alpha^{219}(\alpha^{-5}) + \alpha^{229}$$
$$= 0$$
$$\sigma(\alpha^{-12}) = \alpha^{248}(\alpha^{-12})^3 + \alpha^{212}(\alpha^{-12})^2 + \alpha^{219}(\alpha^{-12}) + \alpha^{229}$$
$$= 0$$

On the other hand, the error patterns, at the above mentioned error locations $\alpha^{-2}$, $\alpha^{-5}$ and $\alpha^{-12}$, are respectively calculated by executing $$e_i=p(X)/[\sigma'(X)\cdot X]$$

More specifically,

Error pattern of $\alpha^{-2}$
$=[\alpha^{73}(\alpha^{-2})^2+\alpha^{52}(\alpha^{-2})+\alpha^{54}]/[(\alpha^{248}(\alpha^{-2})^2+\alpha^{219})\alpha^{-2}]$
$=\alpha^{11}$ Error pattern of $\alpha^{-5}$
$=[\alpha^{73}(\alpha^{-5})^2+\alpha^{52}(\alpha^{-5})+\alpha^{54}]/[(\alpha^{248}(\alpha^{-5})^2+\alpha^{219})\alpha^{-5}]$
$\alpha^8$ Error pattern of $\alpha^{-12}$
$=[\alpha^{73}(\alpha^{-12})^2+\alpha^{52}(\alpha^{-12})+\alpha^{54}]/[(\alpha^{248}(\alpha^{-12})^2+\alpha^{219})\alpha^{-12}]$
$=\alpha^3$ It will be understood that the above disclosure is representative of few possible embodiments of the present invention and that the concept on which the present invention is based is not specially limited thereto.

What is claimed:

1. A hardware arrangement for determining an error location and a corresponding error pattern of a code word in a Galois Field using a Chien search algorithm, comprising:

a first unit for receiving a plurality of coefficients of an error locator polynomial except for a lowest coefficient of said error location polynomial, said first unit outputting said plurality of coefficients at an initial stage of error detection, said first unit multiplying said plurality of coefficients by respective elements of the Galois Field previously stored in said first unit and outputting the multiplication results at each stage following said initial stage;

a detection unit for detecting, at each stage of said error detection, an all-zero state of said lowest coefficient and the outputs of said first unit;

a counter for counting up by one during each stage of said error detection;

a latch for latching the output of said counter if said all-zero state is detected, said output of said counter indicating the error location;

a first logic gate for implementing, at said initial stage, an exclusive-or operation on said lowest coefficient and odd coefficients among said coefficients applied to said first unit, and at each stage following said initial stage, an exclusive-or operation on said lowest coefficient and the multiplication results that include odd coefficients;

a second unit for receiving a plurality of coefficients of an error value polynomial except for a lowest coefficient of said error value polynomial, said second unit outputting said plurality of coefficients of said error value polynomial at said initial stage, said second unit multiplying said plurality of coefficients of said error value polynomial by respective elements of the Galois Field previously stored in said second unit and outputting the multiplication results at each stage following said initial stage;

a second logic gate for implementing, at each stage of said error detection, an exclusive-or operation on said lowest coefficient of said error value polynomial and the output of said second unit; and an error pattern calculator for calculating said error pattern using the outputs of said detection unit and said first and second logic gates.

2. A hardware arrangement as claimed in claim 1, wherein said second unit contains a plurality of selection circuits, each selection circuit including a selector, a multiplier and a register, each selector having an input connection to a polynomial generator and outputs respectively connected to a corresponding multiplier and to said second logic gate, each multiplier having an input connected to the corresponding selector and an output connected to a corresponding register, each register having an input connected to the corresponding multiplier and an output connected to the corresponding selector, each multiplier previously storing a corresponding element of the Galois Field.

3. A method of determining an error location and a corresponding error pattern of a code word in a Galois Field using a Chien search algorithm, comprising:

receiving a plurality of coefficients of an error locator polynomial except for a lowest coefficient of said polynomial in a first unit;

outputting from said first unit said plurality of coefficients at an initial stage of error detection, multiplying in said first unit said plurality of coefficients by respective elements of the Galois Field previously stored in said first unit and outputting the multiplication results at each stage following said initial stage;

detecting, at each stage of said error detection, an all-zero state of said lowest coefficient and the outputs of said first unit, and outputting a detecting result from a detecting unit;

incrementing a counter by one during each stage of said error detection;

latching an output of said counter if said all-zero state is detected, said output of said counter indicating an error location;

implementing an exclusive-or operation on said lowest coefficient and odd coefficients among said coefficients applied to said first unit at said initial stage;

implementing an exclusive-or operation on said lowest coefficient and the multiplication results including odd coefficients at each stage following said initial stage;

receiving a plurality of coefficients of an error value polynomial except for a lowest coefficient of said error value polynomial in a second unit;

outputting from said second unit said plurality of coefficients of said error value polynomial at said initial stage;

multiplying in said second unit said plurality of coefficients of said error value polynomial by respective elements of the Galois Field previously stored in said second unit and outputting the multiplication results at each stage following said initial stage;

implementing, at each stage of said error detection, an exclusive-or operation on said lowest coefficient of said error value polynomial and the output of said second unit; and calculating said error pattern using the outputs of said detection unit and said first and second logic gates.

4. A method as claimed in claim 3, wherein said second unit contains a plurality of selection circuits, each selection circuit including a selector, a multiplier and a register, each selector having an input connection to a polynomial generator and outputs respectively connected to a corresponding multiplier and to said second logic gate, each multiplier having an input connected to the corresponding selector and an output connected to a corresponding register, each register having an input connected to the corresponding multiplier and an output connected to the corresponding selector, each multiplier previously storing a corresponding element of the Galois Field.

* * * * *